(12) United States Patent
Hirata et al.

(10) Patent No.: US 11,830,920 B2
(45) Date of Patent: Nov. 28, 2023

(54) SEMICONDUCTOR DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Naofumi Hirata, Himeji Hyogo (JP); Tomomi Kuraguchi, Himeji Hyogo (JP); Shinichi Ueki, Ibo Hyogo (JP); Yoichi Hori, Himeji Hyogo (JP); Kei Tanihira, Himeji Hyogo (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 161 days.

(21) Appl. No.: 17/406,525

(22) Filed: Aug. 19, 2021

(65) Prior Publication Data
US 2022/0293762 A1   Sep. 15, 2022

(30) Foreign Application Priority Data

Mar. 15, 2021   (JP) ................. 2021-041019

(51) Int. Cl.
*H01L 29/47* (2006.01)
*H01L 29/78* (2006.01)
(Continued)

(52) U.S. Cl.
CPC .......... *H01L 29/47* (2013.01); *H01L 29/7806* (2013.01); *H01L 29/872* (2013.01); *H01L 29/1608* (2013.01)

(58) Field of Classification Search
CPC ... H01L 29/47; H01L 29/7806; H01L 29/872; H01L 29/0619; H01L 29/1608;
(Continued)

(56) References Cited

U.S. PATENT DOCUMENTS

| 5,886,383 A | 3/1999 | Kinzer |
| 9,184,307 B2 | 11/2015 | Tarui et al. |

(Continued)

FOREIGN PATENT DOCUMENTS

| JP | 2001-077379 A | 3/2001 |
| JP | 2015-204333 A | 11/2015 |

(Continued)

OTHER PUBLICATIONS

Kim, J.S. et al. "Schottky barrier rectifier with high current density using vanadium as barrier metal", Applied Physics Letters, vol. 79, No. 6, Aug. 6, 2001, pp. 860-862 (3 pages).
(Continued)

*Primary Examiner* — Shahed Ahmed
*Assistant Examiner* — Khatib A Rahman
(74) *Attorney, Agent, or Firm* — Kim & Stewart LLP (57) ABSTRACT

A semiconductor device includes a semiconductor part including a first semiconductor layer of a first conductivity type; a first electrode provided on a back surface of the semiconductor part; and a second electrode provided on a front surface of the semiconductor part. The second electrode includes a barrier layer and a metal layer. The barrier layer contacts the first semiconductor layer and including vanadium or a vanadium compound as a major component. The metal layer is provided on the barrier layer.

13 Claims, 5 Drawing Sheets

(51) Int. Cl.
*H01L 29/872* (2006.01)
*H01L 29/16* (2006.01)

(58) Field of Classification Search
CPC . H01L 29/2003; H01L 29/0603; H01L 29/24; H01L 29/36; H01L 29/475; H01L 29/0684
See application file for complete search history.

(56) References Cited

U.S. PATENT DOCUMENTS

| | | | |
|---|---|---|---|
| 9,590,050 B2 | 3/2017 | Hitora | |
| 9,812,589 B2 | 11/2017 | Shimizu et al. | |
| 10,211,285 B2 | 2/2019 | Nagao | |
| 2011/0309371 A1* | 12/2011 | Hsu | H01L 29/063 257/E29.089 |
| 2012/0241853 A1 | 9/2012 | Ohta et al. | |
| 2013/0119393 A1* | 5/2013 | Zhu | H01L 25/18 438/572 |
| 2015/0091022 A1* | 4/2015 | Kawaguchi | H01L 29/872 438/653 |
| 2017/0077236 A1 | 3/2017 | Hori et al. | |
| 2017/0154974 A1 | 6/2017 | Hilsenbeck | |
| 2018/0190651 A1 | 7/2018 | Siemieniec et al. | |
| 2019/0088648 A1 | 3/2019 | Hori | |
| 2019/0371935 A1 | 12/2019 | Hatta et al. | |
| 2019/0386129 A1 | 12/2019 | Lee et al. | |
| 2020/0144376 A1 | 5/2020 | Hitora et al. | |

FOREIGN PATENT DOCUMENTS

| | | |
|---|---|---|
| JP | 2017-055001 A | 3/2017 |
| JP | 2017-098578 A | 6/2017 |
| JP | 2018-078348 A | 5/2018 |
| JP | 2018-110234 A | 7/2018 |
| JP | 2018-181917 A | 11/2018 |
| JP | 6443281 B2 | 12/2018 |
| JP | 2020-036041 A | 3/2020 |
| JP | 2020-074443 A | 5/2020 |

OTHER PUBLICATIONS

Drobny, V. F. "Nearly Ideal Unguarded Vanadium-Silicide Schottky-Barrier Diodes", IEEE Transactions on Electron Devices, vol. ED-33, No. 9, Sep. 1, 1986, New York, NY, USA, pp. 1294-1298 (4 pages).

* cited by examiner

SEMICONDUCTOR DEVICE

CROSS-REFERENCE TO RELATED APPLICATIONS

This application is based upon and claims the benefit of priority from Japanese Patent Application No. 2021-041019, filed on Mar. 15, 2021; the entire contents of which are incorporated herein by reference.

FIELD

Embodiments relate to a semiconductor device.

BACKGROUND

A semiconductor device is required to improve the electrical characteristics. For example, it is desirable for a Schottky barrier diode to have a low forward voltage and a low reverse current.

DETAILED DESCRIPTION

According to an embodiment, a semiconductor device includes a semiconductor part including a first semiconductor layer of a first conductivity type; a first electrode provided on a back surface of the semiconductor part; and a second electrode provided on a front surface of the semiconductor part. The second electrode includes a barrier layer and a metal layer. The barrier layer contacts the first semiconductor layer and including vanadium or a vanadium compound as a major component. The metal layer is provided on the barrier layer.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

First Embodiment

Figure 1:
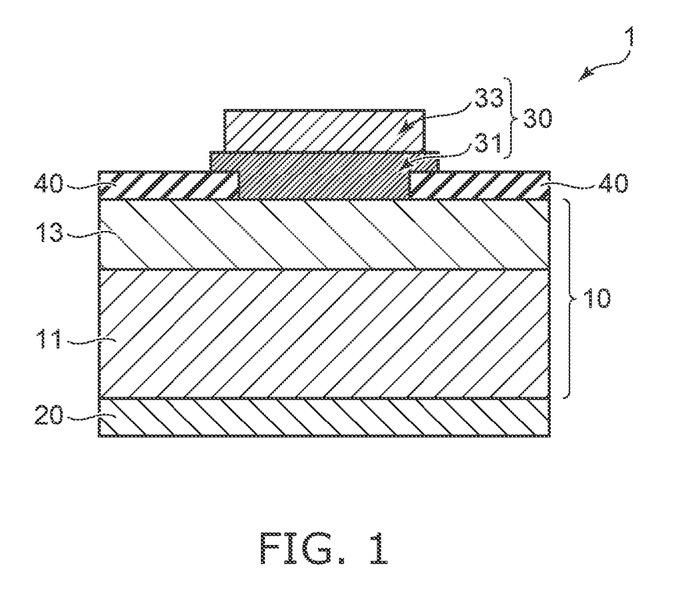
FIG. 1 is a schematic cross-sectional view showing a semiconductor device according to a first embodiment.

FIG. 1 is a schematic cross-sectional view showing a semiconductor device 1 according to a first embodiment. The semiconductor device 1 is, for example, a Schottky barrier diode.

As shown in FIG. 1, the semiconductor device 1 includes a semiconductor part 10, a first electrode 20, a second electrode 30, and an insulating film 40.

The semiconductor part 10 includes, for example, a semiconductor substrate 11 of a first conductivity type, and a first semiconductor layer 13 of the first conductivity type. The semiconductor substrate 11 is, for example, an n-type silicon carbide (SiC) substrate. The first semiconductor layer 13 is, for example, an n-type SiC layer or an n-type gallium nitride (GaN) layer. The first semiconductor layer 13 is epitaxially grown on the semiconductor substrate 11. In the following description, the first conductivity type is taken to be an n-type; and the second conductivity type is taken to be a p-type.

The semiconductor part 10 includes a front surface, and a back surface at the side opposite to the front surface. The first electrode 20 is provided on the back surface of the semiconductor part 10. The second electrode 30 is provided on the front surface of the semiconductor part 10. The semiconductor substrate 11 is positioned between the first semiconductor layer 13 and the first electrode 20. The first semiconductor layer 13 is positioned between the semiconductor substrate 11 and the second electrode 30. The first electrode 20 is, for example, a metal layer that includes gold (Au) or aluminum (Al).

The second electrode 30 includes, for example, a barrier layer 31 and a metal layer 33. The barrier layer 31 contacts the first semiconductor layer 13 and includes, for example, vanadium (V) or vanadium compound as a major component. The metal layer 33 is provided on the barrier layer 31 and includes, for example, molybdenum (Mo) or aluminum (Al).

A Schottky contact is provided between the barrier layer 31 and the first semiconductor layer 13. The barrier layer 31 includes, for example, the at least one selected from the group consisting of vanadium metal (V), vanadium nitride (VN), silicon-vanadium (SiV), aluminum-vanadium (AlV), and vanadium carbide (VC). The barrier layer 31 is formed using, for example, sputtering. Here, silicon-vanadium (SiV) is vanadium silicide or an alloy of silicon and vanadium. Aluminum-vanadium is an alloy of aluminum and vanadium. The barrier layer 31 may include an intermetallic compound that includes vanadium.

For example, vanadium metal is formed by sputtering using a target that includes vanadium having a purity of not less than 99.9 weight %. Vanadium metal includes, for example, not more than 0.1 weight % of iron, chrome, nickel, etc., as an impurity.

For example, vanadium nitride is formed using reactive sputtering using a target that includes vanadium having a purity of not less than 99.9 weight %. For example, iron, chrome, nickel, or the like, or a nitride of these elements is included as an impurity in vanadium nitride.

For example, silicon-vanadium (SiV) is formed using sputtering using a target that includes vanadium silicide having a purity of not less than 99.9 weight %.

For example, vanadium carbide (VC) is formed using sputtering using a target that includes vanadium carbide having a purity of not less than 99 weight %.

The barrier layer 31 is not limited to the example described above and may include, for example, an alloy layer of vanadium metal and the first semiconductor layer 13.

The insulating film 40 is provided on the front surface of the semiconductor part 10. The insulating film 40 is, for example, a silicon oxide film and is formed using CVD (Chemical Vapor Deposition). The second electrode 30 is connected to the first semiconductor layer 13 via a contact hole provided in the insulating film 40. The barrier layer 31 contacts the first semiconductor layer 13 that is exposed at the bottom surface of the contact hole.

Figure 2A:
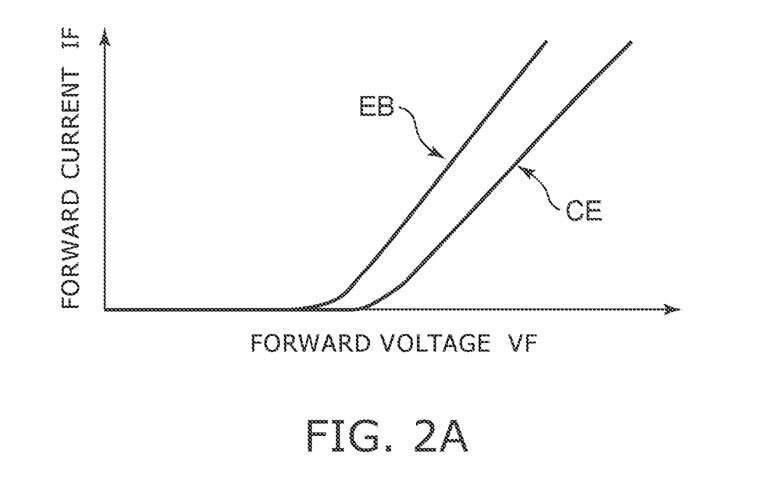
FIGS. 2A and 2B are graphs showing characteristics of the semiconductor device according to the first embodiment.
Figure 2B:
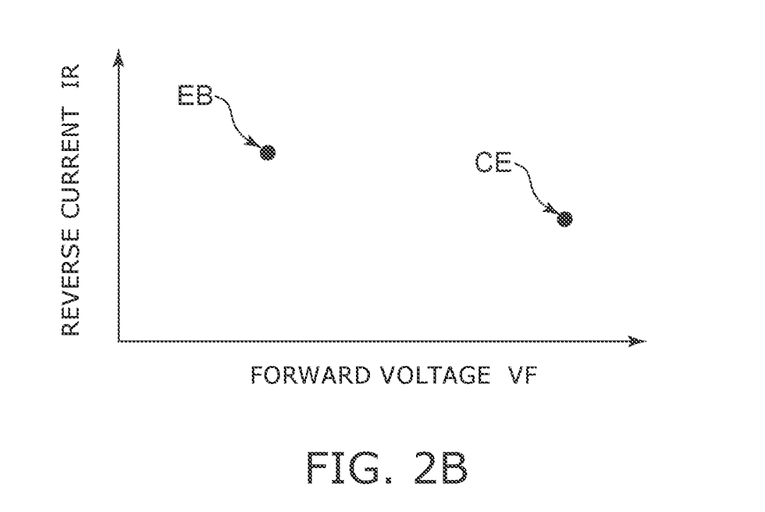

FIGS. 2A and 2B are graphs showing characteristics of the semiconductor device 1 according to the first embodiment. FIG. 2A is a graph showing the forward characteristic of the semiconductor device 1. FIG. 2B is a graph showing the relationship between a forward voltage VF and a reverse current IR.

FIGS. 2A and 2B show a characteristic EB of the semiconductor device 1 and a characteristic CE of a semiconductor device according to a comparative example. The barrier layer 31 of the semiconductor device 1 includes vanadium metal. The barrier layer of the semiconductor device according to the comparative example includes titanium (Ti).

In FIG. 2A, the horizontal axis is the forward voltage VF, and the vertical axis is a forward current IF. As shown in FIG. 2A, the forward voltage VF of the semiconductor device 1 is less than the forward voltage VF of the semiconductor device according to the comparative example.

In FIG. 2B, the horizontal axis is the forward voltage VF, and the vertical axis is the reverse current IR. It is found in FIGS. 2A and 2B that the forward voltage VF can be reduced in the semiconductor device 1 by using the barrier layer 31 that includes vanadium metal, compared to the semiconductor device according to the comparative example.

However, it can be seen in FIG. 2 that the reverse current IR of the semiconductor device 1 increases. Thus, it is desirable to reduce the reverse current IR to further improve the current-voltage characteristic of the semiconductor device 1.

Figure 3A:
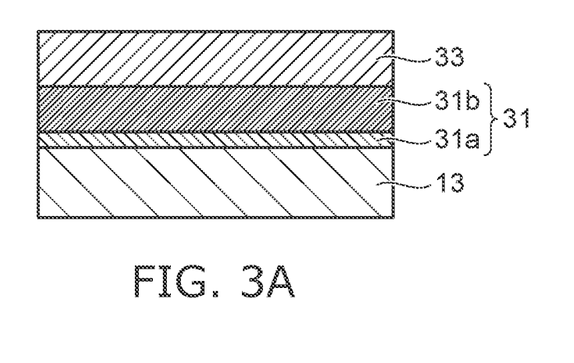
FIGS. 3A to 3C are schematic cross-sectional views showing electrode structures of the semiconductor device according to modifications of the first embodiment.
Figure 3B:
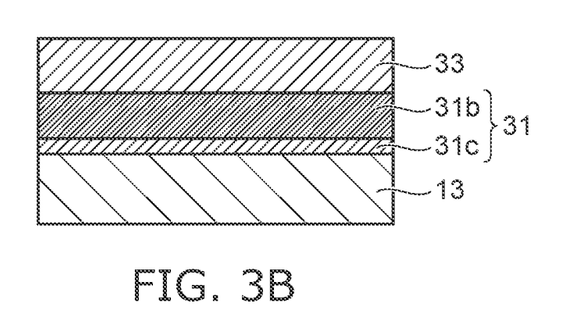
Figure 3C:
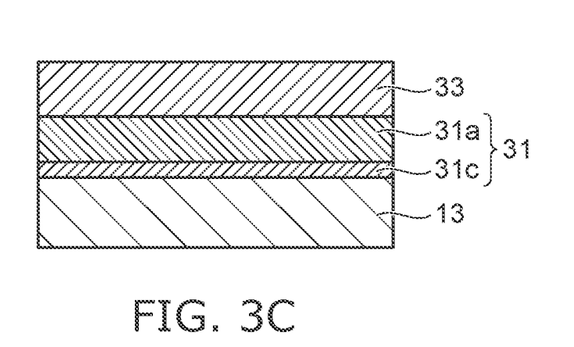

FIGS. 3A to 3C are schematic cross-sectional views showing electrode structures of the semiconductor device 1 according to modifications of the first embodiment. As shown in FIGS. 3A to 3C, the barrier layer 31 may have a stacked structure that includes at least two layers.

As shown in FIG. 3A, the barrier layer 31 may include a first layer 31a and a second layer 31b. The first layer 31a contacts the first semiconductor layer 13. The second layer 31b is provided between the first layer 31a and the metal layer 33. The first layer 31a includes, for example, vanadium nitride (VN). The second layer 31b includes, for example, vanadium metal (V).

As shown in FIG. 3B, the barrier layer 31 may include a first layer 31c and the second layer 31b. The first layer 31c contacts the first semiconductor layer 13. The second layer 31b is provided between the first layer 31c and the metal layer 33. The first layer 31c includes, for example, at least one of silicon-vanadium (SiV) or vanadium carbide (VC). The second layer 31b includes, for example, vanadium metal (V).

As shown in FIG. 3C, the barrier layer 31 may include the first layer 31c and a second layer 31a. The first layer 31c contacts the first semiconductor layer 13. The second layer 31a is provided between the first layer 31c and the metal layer 33. The first layer 31c includes, for example, at least one of silicon-vanadium (SiV) or vanadium carbide (VC). The second layer 31a includes, for example, vanadium nitride (VN).

In the semiconductor device 1, for example, the current-voltage characteristic may be improved by using one of the stacked structure described above or the single-layer barrier layer of layer 31a or 31c.

Figure 4:
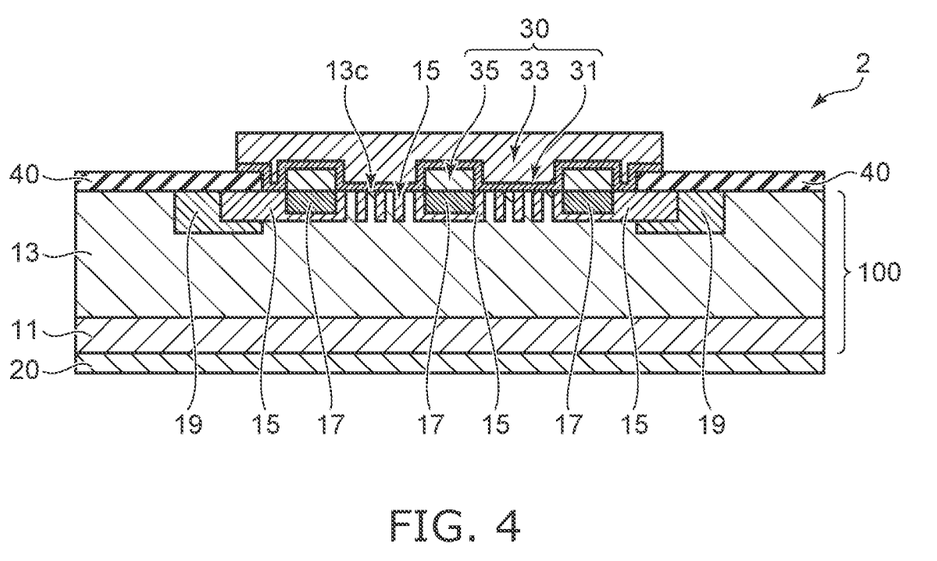
FIG. 4 is a schematic cross-sectional view showing a semiconductor device according to a modification of the first embodiment.

FIG. 4 is a schematic cross-sectional view showing a semiconductor device 2 according to a modification of the first embodiment.

The semiconductor device 2 includes a semiconductor part 100. The first electrode 20 is provided on the back surface of the semiconductor part 100. The second electrode 30 is provided on the front surface of the semiconductor part 100.

The semiconductor part 100 includes the semiconductor substrate 11 of the first conductivity type, the first semiconductor layer 13 of the first conductivity type, a second semiconductor layer 15 of the second conductivity type, a third semiconductor layer 17 of the second conductivity type, and a fourth semiconductor layer 19 of the second conductivity type.

The second electrode 30 includes the barrier layer 31, the metal layer 33, and a contact layer 35. The second electrode 30 contacts the semiconductor part 100 via a contact hole that is provided in the insulating film 40. The barrier layer 31 is provided between the semiconductor part 100 and the metal layer 33. The contact layer 35 is provided between the semiconductor part 100 and the barrier layer 31.

The semiconductor substrate 11 is provided between the first electrode 20 and the first semiconductor layer 13 and is electrically connected to the first electrode 20. The first semiconductor layer 13 is provided between the semiconductor substrate 11 and the second electrode 30.

The second semiconductor layer 15 is provided between the first semiconductor layer 13 and the second electrode 30. The second semiconductor layer 15 includes the same material as the first semiconductor layer 13. The second semiconductor layer 15 further includes a second-conductivity-type impurity.

The third semiconductor layer 17 is provided between the second semiconductor layer 15 and the second electrode 30. The third semiconductor layer 17 includes the same material as the first semiconductor layer 13. The third semiconductor layer 17 includes a second-conductivity-type impurity with a higher concentration than the concentration of the second-conductivity-type impurity of the second semiconductor layer 15.

The contact layer 35 of the second electrode 30 is provided between the third semiconductor layer 17 and the barrier layer 31. The contact layer 35 contacts the third semiconductor layer 17 and the barrier layer 31. The contact layer 35 includes a material that provides, for example, an ohmic connection between the third semiconductor layer 17 and the contact layer 35. The contact layer 35 includes, for example, nickel (Ni).

The second electrode 30 is electrically connected to the third semiconductor layer 17 via the contact layer 35. The second electrode 30 also is electrically connected to the second semiconductor layer 15 via the third semiconductor layer 17.

The second semiconductor layer 15 includes a portion that is provided between the first semiconductor layer 13 and the third semiconductor layer 17, and other portion that contacts the barrier layer 31 of the second electrode 30. The first semiconductor layer 13 extends into the other portion of the second semiconductor layer 15. That is, the first semiconductor layer 13 includes an extension portion 13c that contacts the barrier layer 31 of the second electrode 30.

For example, a Schottky contact is provided between the extension portion 13c of the first semiconductor layer 13 and the barrier layer 31 of the second electrode 30. The first semiconductor layer 13 includes, for example, multiple extension portions 13c. The second semiconductor layer 15 includes a plurality of the other portions that contact the barrier layer 31 of the second electrode 30. The other portions of the second semiconductor layer 15 each are provided between the extension portions 13c that are next to each other in a direction along the front surface of the semiconductor part 100.

The fourth semiconductor layer 19 is provided between the first semiconductor layer 13 and the insulating film 40. The fourth semiconductor layer 19 includes the same material as the first semiconductor layer 13. The fourth semiconductor layer 19 surrounds the second semiconductor layer 15. The fourth semiconductor layer 19 is connected to the second semiconductor layer 15, and includes a second-conductivity-type impurity with a lower concentration than the concentration of the second-conductivity-type impurity in the second semiconductor layer 15.

The fourth semiconductor layer 19 relaxes the electric field concentration at the outer perimeter of the second semiconductor layer 15 and increases the reverse breakdown voltage of the semiconductor device 2. The fourth semiconductor layer 19 is included in a so-called RESURF (Reduced Surface Field) structure.

In the semiconductor device 2, for example, by providing a Schottky junction and a p-n junction between the semiconductor part 100 and the second electrode 30, the forward voltage VF and the reverse current IR can be reduced. In other words, the forward voltage VF has a value that is less than the built-in voltage of the p-n junction. On the other hand, when the reverse voltage is applied between the first electrode 20 and the second electrode 30, the p-n junction operates dominantly and may reduce the reverse current.

Also, the forward voltage VF can be reduced by the barrier layer 31 of the second electrode 30 that includes a material including vanadium (V) as a major component. The extension portion 13c of the first semiconductor layer 13 is depleted at a low bias, because a depletion layer spreads from the p-n junction when the reverse voltage is applied between the first electrode 20 and the second electrode 30. Then, the electric field at the p-n junction becomes greater than the electric field at the Schottky junction. Thus, the increase of the reverse current IR due to the Schottky junction can be suppressed, and the reverse current of the semiconductor device 2 is reduced.

When the barrier layer 31 of the second electrode 30 includes vanadium metal, the increase of the reverse current IR (referring to FIG. 2B) can be prevented in the semiconductor device 2. Thereby, the current-voltage characteristic is improved in the semiconductor device 2.

It should be noted that the embodiment is not limited to the features described in FIG. 4. For example, there may be more or less than four extension portions 13c of the first semiconductor layer 13 provided between the adjacent third semiconductor layers 17. Also, there may be more or less than three third semiconductor layers 17 in the second semiconductor layer 15 so that each third semiconductor layer is provided between the second semiconductor layer 17 and the contact layer 35.

Second Embodiment

Figure 5:
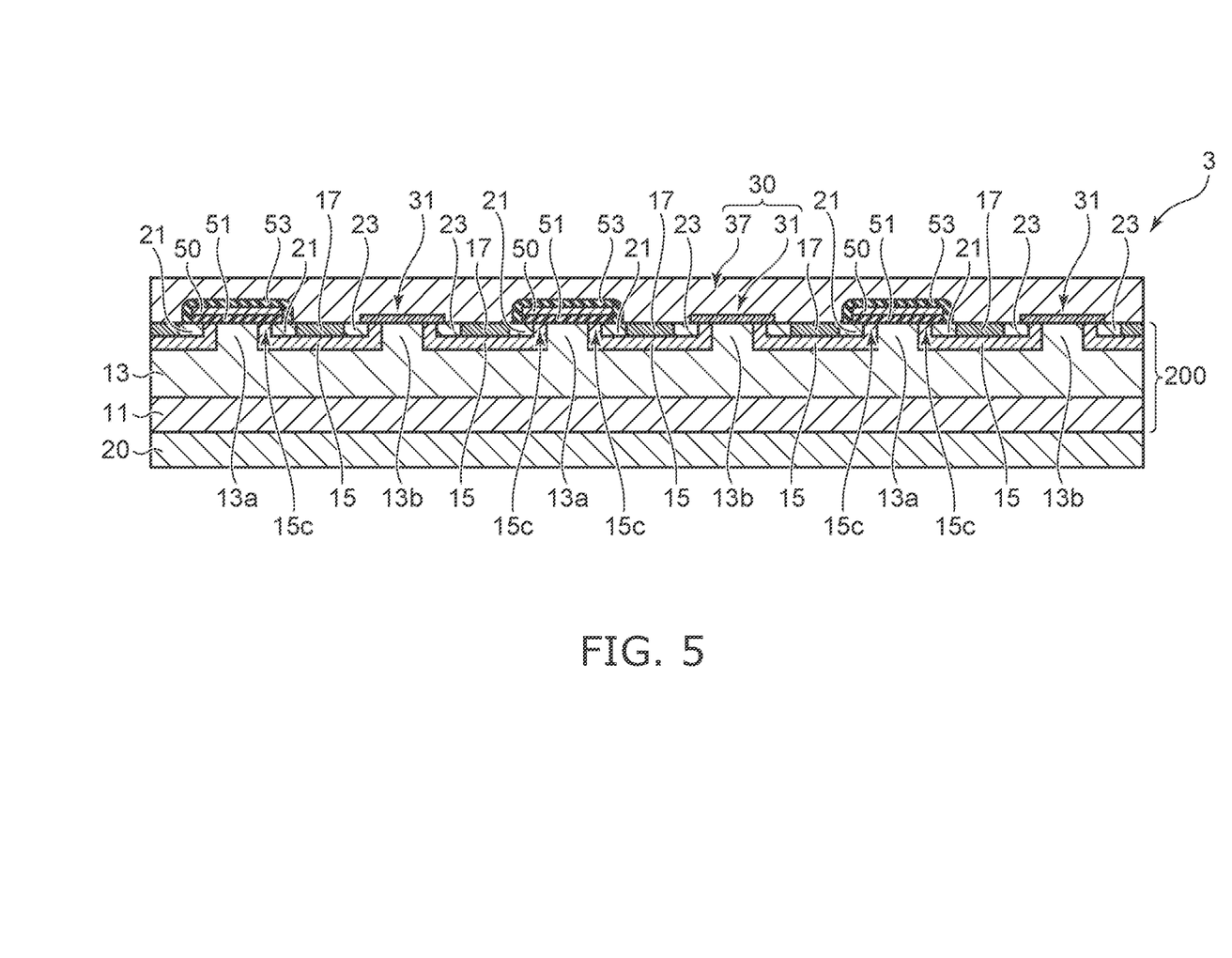
FIG. 5 is a schematic cross-sectional view showing a semiconductor device according to a second embodiment.

FIG. 5 is a schematic cross-sectional view showing a semiconductor device 3 according to a second embodiment.

In the semiconductor device 3, a MOSFET (Metal Oxide Semiconductor Field Effect Transistor) and a Schottky barrier diode are integrated.

The semiconductor device 3 includes a semiconductor part 200. The first electrode 20 is provided on the back surface of the semiconductor part 200. The second electrode 30 is provided on the front surface of the semiconductor part 200. The first electrode 20 serves, for example, as both a drain electrode and a cathode electrode. The second electrode 30 serves, for example, as both a source electrode and an anode electrode.

The semiconductor device 3 further includes a control electrode 50. The control electrode 50, for example, is provided on the front surface of the semiconductor part 200 with a gate insulating film 51 interposed. The control electrode 50 is provided between the second electrode 30 and the semiconductor part 200. The control electrode 50 is electrically insulated from the second electrode 30 by, for example, an inter-layer insulating film 53.

The semiconductor part 200 includes the semiconductor substrate 11 of the first conductivity type, the first semiconductor layer 13 of the first conductivity type, the second semiconductor layer 15 of the second conductivity type, the third semiconductor layer 17 of the second conductivity type, a fifth semiconductor layer 21 of the first conductivity type, and a sixth semiconductor layer 23 of the first conductivity type.

The semiconductor substrate 11 is provided between the first electrode 20 and the first semiconductor layer 13. The semiconductor substrate 11 is electrically connected to the first electrode 20. The first semiconductor layer 13 is provided between the semiconductor substrate 11 and the second electrode 30. The semiconductor substrate 11 includes a first-conductivity-type impurity with a higher concentration than the concentration of the first-conductivity-type impurity in the first semiconductor layer 13. The first semiconductor layer 13 is, for example, an n-type drift layer.

The second semiconductor layer 15 is provided between the first semiconductor layer 13 and the second electrode 20. The second semiconductor layer 15 includes the same material as the first semiconductor layer 13. The second semiconductor layer 15 further includes a second-conductivity-type impurity. The second semiconductor layer 15 is, for example, a p-type diffusion layer.

The third semiconductor layer 17 is provided between the second semiconductor layer 15 and the second electrode 30. The third semiconductor layer 17 includes the same material as the first semiconductor layer 13. The third semiconductor layer 17 includes a second-conductivity-type impurity with a higher concentration than the concentration of the second-conductivity-type impurity in the second semiconductor layer 15.

The third semiconductor layer 17 is, for example, a p-type contact layer. The third semiconductor layer 17 is electrically connected to the second electrode 30. The second semiconductor layer 15 is electrically connected to the second electrode 30 via the third semiconductor layer 17.

The fifth semiconductor layer 21 is provided between the second semiconductor layer 15 and the second electrode 30. The fifth semiconductor layer 21 includes the same material as the first semiconductor layer 13.

The sixth semiconductor layer 23 is provided between the second semiconductor layer 15 and the second electrode 30. The sixth semiconductor layer 23 includes the same material as the first semiconductor layer 13.

For example, the third semiconductor layer 17, the fifth semiconductor layer 21, and the sixth semiconductor layer 23 are arranged along the front surface of the semiconductor part 200 between the second semiconductor layer 15 and the second electrode 30. The third semiconductor layer 17 is provided between the fifth semiconductor layer 21 and the sixth semiconductor layer 23. The fifth semiconductor layer 21 is electrically connected to the second electrode 30.

As shown in FIG. 5, multiple second semiconductor layers 15 are arranged along the front surface of the semiconductor part 200. The multiple second semiconductor layers 15 are apart from each other. The first semiconductor layer 13 includes a first portion 13a that extends between two adjacent second semiconductor layers 15, and a second portion 13b that extends between two other adjacent second semiconductor layers 15. The second semiconductor layer 15 includes a channel portion 15c; and the first portion 13a of the first semiconductor layer 13 and the channel portion 15c of the second semiconductor layer 15 are arranged along the front surface of the semiconductor part 200.

The control electrode 50 faces the first portion 13a of the first semiconductor layer 13 and the channel portion 15c of the second semiconductor layer 15 via the gate insulating film 51. The fifth semiconductor layer 21 faces the first portion 13a of the first semiconductor layer 13 via the channel portion 15c of the second semiconductor layer 15. In other words, the first portion 13a of the first semiconductor layer 13, the channel portion 15c of the second semiconductor layer 15, and the fifth semiconductor layer 21 are arranged along the front surface of the semiconductor part 200. Thus, a MOS gate structure includes the first portion 13a of the first semiconductor layer 13, the channel portion 15c of the second semiconductor layer 15, the fifth semiconductor layer 21, the control electrode 50, and the gate insulating film 51.

The barrier layer 31 contacts the second portion 13b of the first semiconductor layer 13. The barrier layer 31 contacts a portion of the second semiconductor layer 15 that is positioned between the third semiconductor layer 17 and the second portion 13b of the first semiconductor layer 13.

The second electrode 30 includes the barrier layer 31 and a metal layer 37. The barrier layer 31 is provided between the metal layer 37 and the second portion 13b of the first semiconductor layer 13. For example, the metal layer 37 covers the front side of the semiconductor part 200 and contacts the third semiconductor layer 17, the fifth semiconductor layer 21, and the barrier layer 31. The metal layer 37 is electrically connected to the third semiconductor layer 17, the fifth semiconductor layer 21, and the barrier layer 31. The control electrode 50 is electrically insulated from the metal layer 37 by the inter-layer insulating film 53.

The barrier layer 31 is, for example, a metal layer that includes vanadium as a major component, and contacts the second portion 13b of the first semiconductor layer 13. A Schottky contact, for example, is provided between the barrier layer 31 and the first semiconductor layer 13. The barrier layer 31 includes, for example, at least one selected from the group consisting of vanadium metal (V), vanadium nitride (VN), silicon-vanadium (SiV), aluminum-vanadium (AlV), and vanadium carbide (VC).

Thus, the semiconductor device 3 has a structure in which a MOS gate structure and a Schottky junction are integrated at the front surface side of the semiconductor part 200. The Schottky junction having a low VF can be achieved by the barrier layer 31 that includes vanadium as a major component. The forward current density of the Schottky junction can be increased thereby, and the area occupied by the Schottky junction can be reduced in the front surface of the semiconductor part 200.

The first and second embodiments are provided as examples; the invention is not limited thereto. The materials of the semiconductor substrate 11 and the first semiconductor layer 13, for example, are not limited to silicon carbide (SiC) and gallium nitride (GaN), and may be a nitride semiconductor other than gallium nitride or an oxide semiconductor such as gallium oxide, etc. Although a MOS gate structure and a Schottky junction are alternately arranged in the example shown in FIG. 5, the embodiments are not limited thereto. For example, multiple MOS gate structures may be provided between two adjacent Schottky junctions.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, the device comprising:
    a semiconductor part including a first semiconductor layer of a first conductivity type;
    a first electrode provided on a back surface of the semiconductor part; and
    a second electrode provided on a front surface of the semiconductor part,
    the second electrode including
        a barrier layer contacting the first semiconductor layer, and
        a metal layer provided on the barrier layer,
    the barrier layer including a first layer contacting the first semiconductor layer and a second layer provided between the first layer and the metal layer, the first layer including at least one of vanadium carbide, vanadium nitride, an alloy of vanadium and aluminum, or an alloy of vanadium and silicon, and the second layer including vanadium metal.

2. The device according to claim 1, wherein the first semiconductor layer is a silicon carbide layer.

3. The device according to claim 1, wherein the first semiconductor layer is a gallium nitride layer.

4. The device according to claim 1, wherein the semiconductor part includes a nitride semiconductor or an oxide semiconductor.

5. The device according to claim 1, wherein the semiconductor part further includes a second semiconductor layer of a second conductivity type, the second semiconductor layer being provided between the first semiconductor layer and the second electrode, and the first semiconductor layer includes a portion that extends into the second semiconductor layer and contacts the barrier layer of the second electrode.

6. The device according to claim 5, wherein the second electrode further includes a contact layer, the contact layer being electrically connected to the second semiconductor layer.

7. The device according to claim 6, wherein
the barrier layer includes a first portion contacting the first semiconductor layer, and a second portion provided between the contact layer and the metal layer.

8. A semiconductor device, comprising:
a semiconductor part including a first semiconductor layer of a first conductivity type, a second semiconductor layer of a second conductivity type, a third semiconductor layer of the second conductivity type, and a fourth semiconductor layer of the second conductivity type;
a first electrode provided on a back surface of the semiconductor part; and
a second electrode provided on a front surface of the semiconductor part,
the second semiconductor layer being provided between the first semiconductor layer and the second electrode,
the second electrode including
a contact layer electrically connected to the second semiconductor layer,
a barrier layer including vanadium or a vanadium compound as a major component, and
a metal layer provided on the barrier layer,
the first semiconductor layer including a portion that extends into the second semiconductor layer and contacts the barrier layer,
the barrier layer including a first portion contacting the first semiconductor layer, and a second portion provided between the contact layer and the metal layer,
the third semiconductor layer being provided between the second semiconductor layer and the contact layer, the third semiconductor layer including a second-conductivity-type impurity with a higher concentration than a second-conductivity-type impurity concentration in the second semiconductor layer,
the fourth semiconductor layer surrounding the second semiconductor layer along the front surface of the semiconductor part, the fourth semiconductor layer including a second-conductivity-type impurity with a lower concentration than the second-conductivity-type impurity concentration in the second semiconductor layer, and
the contact layer being electrically connected to the second semiconductor layer via the third semiconductor layer.

9. The device according to claim 8, wherein
the fourth semiconductor layer covers an outer edge of the second semiconductor layer.

10. A semiconductor device, comprising:
a semiconductor part including a first semiconductor layer of a first conductivity type, a second semiconductor layer of a second conductivity type, and a third semiconductor layer of the first conductivity type;
a first electrode provided on a back surface of the semiconductor part;
a second electrode provided on a front surface of the semiconductor part, the second electrode including
a barrier layer contacting the first semiconductor layer and including vanadium or a vanadium compound as a major component, and
a metal layer provided on the barrier layer; and
a control electrode provided at the front side of the semiconductor part, the control electrode being apart from the barrier layer, the control electrode being electrically insulated from the semiconductor part by a first insulating film, the control electrode facing a portion of the first semiconductor layer via the first insulating film,
the first semiconductor layer including a portion that extends into the second semiconductor layer and contacts the barrier layer,
the second semiconductor layer being provided between the first semiconductor layer and the second electrode, the second semiconductor layer including a portion facing the control electrode via the first insulating film, and
the third semiconductor layer being provided between the second semiconductor layer and the second electrode, the third semiconductor layer contacting the first insulating film, the third semiconductor layer being electrically connected to the metal layer.

11. The device according to claim 10, wherein
the second electrode covers the control electrode,
the control electrode is electrically insulated from the second electrode by a second insulating film, and
the second insulating film is provided between the second electrode and the control electrode.

12. The device according to claim 10, wherein
the semiconductor part further includes a fourth semiconductor layer of the second conductivity type, the fourth semiconductor layer being provided between the second semiconductor layer and the second electrode, the fourth semiconductor layer including a second-conductivity-type impurity with a higher concentration than a concentration of a second-conductivity-type impurity in the second semiconductor layer, and
the metal layer is electrically connected to the fourth semiconductor layer between the barrier layer and the control electrode.

13. The device according to claim 5, wherein
the second semiconductor layer includes a plurality of separate portions provided in the semiconductor part.

* * * * *